(12) United States Patent
Litman et al.

(10) Patent No.: US 10,074,513 B2
(45) Date of Patent: *Sep. 11, 2018

(54) MULTI MODE SYSTEMS WITH RETRACTABLE DETECTORS

(71) Applicant: APPLIED MATERIALS ISRAEL LTD., Rehovot (IL)

(72) Inventors: Alon Litman, Nes-Ziona (IL); Efim Vinnitsky, Ashkelon (IL); Ofir Arzouan, Meitar (IL); Igor Petrov, Holon (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

This patent is subject to a terminal disclaimer.

(21) Appl. No.: 15/414,517

(22) Filed: Jan. 24, 2017

(65) Prior Publication Data

US 2017/0213696 A1 Jul. 27, 2017

Related U.S. Application Data

(63) Continuation-in-part of application No. 15/005,949, filed on Jan. 25, 2016, now Pat. No. 9,818,577.

(51) Int. Cl.
*H01J 37/244* (2006.01)
*H01J 37/28* (2006.01)
*H01J 37/20* (2006.01)

(52) U.S. Cl.
CPC ............ *H01J 37/244* (2013.01); *H01J 37/20* (2013.01); *H01J 37/28* (2013.01);
(Continued)

(58) Field of Classification Search
CPC .. H01J 37/244; H01J 37/28; H01J 2237/2445; H01J 2237/24475; H01J 2237/2448
See application file for complete search history.

(56) References Cited

U.S. PATENT DOCUMENTS 5,214,282 A 5/1993 Yamaguchi et al.
5,500,528 A * 3/1996 Matsui ................. H01J 37/244
250/310

(Continued)

OTHER PUBLICATIONS

U.S. Appl. No. 15/005,949, "Non-Final Office Action", dated Jan. 6, 2017, 13 pages.

(Continued)

*Primary Examiner* — Eliza Osenbaugh-Stewar
(74) *Attorney, Agent, or Firm* — Kilpatrick Townsend & Stockton LLP

(57) ABSTRACT

A method for evaluating a specimen includes positioning a detector in an inserted position in which a first distance between a tip of the detector and a plane extending along a surface of the specimen is less than a distance between the plane and a tip of charged particle beam optics. While maintaining the detector at the inserted position, the surface of the specimen is scanned by a primary beam that exits from the tip of the charged particle beam optics. The detector detects x-ray photons and/or charged particles emitted or reflected from the specimen as a result of scanning the specimen with the primary beam. After completion of the scanning, the detector is positioned at a retracted position in which a second distance between the tip of the detector and the plane exceeds a distance between the tip of the charged particle beam optics and the plane.

16 Claims, 12 Drawing Sheets

(52) U.S. Cl.
CPC ............. *H01J 2237/2445* (2013.01); *H01J 2237/2448* (2013.01); *H01J 2237/24475* (2013.01)

(56) References Cited

U.S. PATENT DOCUMENTS

| | | | |
|---|---|---|---|
| 6,852,982 B1* | 2/2005 | Bierhoff | H01J 37/07 250/306 |
| 9,315,663 B2 | 4/2016 | Appleby et al. | |
| 9,805,909 B1 | 10/2017 | Shemesh et al. | |
| 9,818,577 B2* | 11/2017 | Litman | H01J 37/244 |
| 2002/0079463 A1 | 6/2002 | Shichi et al. | |
| 2002/0100877 A1* | 8/2002 | Ochiai | G01N 23/225 250/489 |
| 2009/0114818 A1* | 5/2009 | Casares | H01J 37/045 250/307 |
| 2012/0132818 A1 | 5/2012 | Falke et al. | |
| 2012/0160999 A1 | 6/2012 | Zaluzec et al. | |
| 2012/0326032 A1 | 12/2012 | Benner et al. | |
| 2015/0235726 A1 | 8/2015 | Ohashi et al. | |
| 2017/0213696 A1 | 7/2017 | Litman et al. | |
| 2017/0213697 A1 | 7/2017 | Litman | |
| 2018/0012728 A1 | 1/2018 | Litman et al. | |

OTHER PUBLICATIONS

U.S. Appl. No. 15/005,949, "Notice of Allowance", dated Jul. 5, 2017, 10 pages.

U.S. Appl. No. 15/703,925 Non-Final Office Action dated Jun. 26, 2018, 12 pages.

\* cited by examiner

MULTI MODE SYSTEMS WITH RETRACTABLE DETECTORS

CROSS-REFERENCE TO RELATED APPLICATIONS

This application is a continuation-in-part of U.S. patent application Ser. No. 15/005,949, filed Jan. 25, 2016, the entire contents of which are incorporated herein by reference in their entirety for all purposes.

BACKGROUND

Charged particle beam systems can be used to inspect specimens such as wafers during semiconductor processing. Detectors can be used to image the specimens or to determine a composition of the specimens. For example, an electron detector may be used to image a specimen by detecting secondary electrons emitted from the specimen and/or backscattered electrons reflected from the specimen. As another example, an energy dispersion x-ray detector (EDX) can be used for determining a composition of a specimen. An EDX detector collects x-ray photons emitted from the specimen and generates an energy spectrum. Energy spectrum means any type of information about energy levels at different wavelengths or frequencies along the spectrum. For example—the energy spectrum can be a histogram that displays the number of X-ray counts for each x-ray energy level. Measuring x-ray energies can help to characterize the element from which an x-ray photon was emitted.

The column that illuminates the specimen is proximate to the specimen and has a relatively big tip. The tip may prevent the detector from being positioned in proximity of the specimen, and often the detector is positioned in an asymmetrical manner in relation to an axis of illumination thereby providing a partial and asymmetrical angular coverage of x-ray photons and/or charged particles emitted or reflected from the specimen.

There is a growing need to improve the accuracy of charge particle beam measurements.

SUMMARY

According to an embodiment of the invention, a method for evaluating a specimen using a charged particle beam system having charged particle beam optics is provided. The method includes positioning a detector in an inserted position in which a first distance between a tip of the detector and a plane extending along a surface of the specimen is less than a distance between a tip of the charged particle beam optics and the plane. The method also includes, while maintaining the detector at the inserted position, scanning the surface of the specimen by a primary beam that exits from the tip of the charged particle beam optics and propagates through an aperture disposed at the tip of the detector, and detecting, by the detector, x-ray photons and/or charged particles emitted or reflected from the specimen as a result of scanning the specimen with the primary beam. After completion of the scanning, the method includes positioning the detector at a retracted position in which a second distance between the tip of the detector and the plane exceeds a distance between the tip of the charged particle beam optics and the plane.

According to an embodiment, the detector is an EDX detector, and the EDX detector detects the x-ray photons emitted from the specimen.

According to another embodiment, the detector is an electron detector, and the electron detector detects secondary electrons emitted from the specimen and/or backscattered electrons reflected from the specimen.

According to yet another embodiment, positioning of the detector at the retracted position includes moving the detector along a first direction that is parallel to the plane and along a second direction that is perpendicular to the plane.

According to another embodiment of the invention, a charged particle beam system includes (i) a controller, (ii) a movable stage configured to support a specimen, (iii) charged particle beam optics having a tip configured to output a primary charged particle beam, (iv) a retractable detector configured to detect x-ray photons and/or charged particles emitted or reflected from the specimen, and (v) an detector motion module configured to move the retractable detector between an inserted position and a retracted position. When the retractable detector is positioned at the inserted position, a tip of the retractable detector is positioned between the tip of the charged particle beam optics and the movable stage. When the retractable detector is positioned at the retracted position, a distance between the tip of the retractable detector and the movable stage exceeds a distance between the tip of the charged particle beam optics and the movable stage.

The charged particle beam system can also include an EDX detector having a tip for detecting the x-ray photons emitted from the specimen and an EDX detector motion module configured to move the EDX detector between an inserted position and a retracted position. When the EDX detector is positioned at the inserted position, the tip of the EDX detector is positioned between the tip of the charged particle beam optics and the movable stage, and when the EDX detector is positioned at the retracted position, a distance between the tip of the EDX detector and the movable stage exceeds a distance between the tip of the charged particle beam optics and the movable stage.

The charged particle beam system can also include an electron detector having a tip for detecting secondary electrons emitted from the specimen and/or backscattered electrons reflected from the specimen and an electron detector motion module configured to move the electron detector between an inserted position and a retracted position. When the electron detector is positioned at the inserted position, the tip of the electron detector is positioned between the tip of the charged particle beam optics and the movable stage, and when the electron detector is positioned at the retracted position, a distance between the tip of the electron detector and the movable stage exceeds a distance between the tip of the charged particle beam optics and the movable stage.

The detector motion module may be configured to move the retractable detector from the retracted position to the inserted position by moving a portion of the retractable detector downwards and moving the portion of the retractable detector outward towards the tip of the charged particle beam optics.

The retractable detector may include a detector amplifier and a detector conduit. The detector conduit may surround a detector conductor that is coupled between the tip of the detector and the detector amplifier.

The charged particle beam system can also include a specimen chamber with one or more chamber openings through which the detector conduit passes. The chamber openings may be sealed by bellows.

The detector conduit may include an upper horizontal portion, a lower horizontal portion comprising the tip, and a sloped intermediate portion that is connected between the upper horizontal portion and the lower horizontal portion.

According to an embodiment of the invention, a method for scanning a specimen using a charged particle beam system having charged particle beam optics, a detector, and a movable stage configured to support the specimen. The method includes positioning the detector in an inserted position between the charged particle beam optics and the specimen so that an axis of a primary beam emitted from a tip of the charged particle beam optics passes through an aperture disposed on a tip of the detector. The method also includes setting the charged particle beam optics to a first voltage, setting the detector to a second voltage, and setting the specimen to a third voltage. The method also includes determining a fourth voltage of an electrode disposed between the tip of the charged particle beam optics and the detector. The fourth voltage is determined based in part on a position of the axis of the charged particle beam relative to a position of the aperture. The fourth voltage is determined to minimize deflection of the primary beam as the primary beam propagates from the tip of the charged particle beam optics, through the aperture, and to the specimen. The method can also include scanning the specimen using the primary beam. The primary beam is emitted from the charged particle beam optics and propagates through the aperture. The scanning is performed while the charged particle beam optics is maintained at the first voltage, the detector is maintained at the second voltage, the specimen is maintained at the third voltage, and the electrode is maintained at the fourth voltage. The method can also include detecting, by the detector, x-ray photons and/or charged particles emitted from the specimen as a result of scanning the specimen with the primary beam.

BRIEF DESCRIPTION OF THE DRAWINGS

The subject matter regarded as the invention is particularly pointed out and distinctly claimed in the concluding portion of the specification. The invention, however, both as to organization and method of operation, together with specimens, features, and advantages thereof, can best be understood by reference to the following detailed description when read with the accompanying drawings in which:

Figure 1:
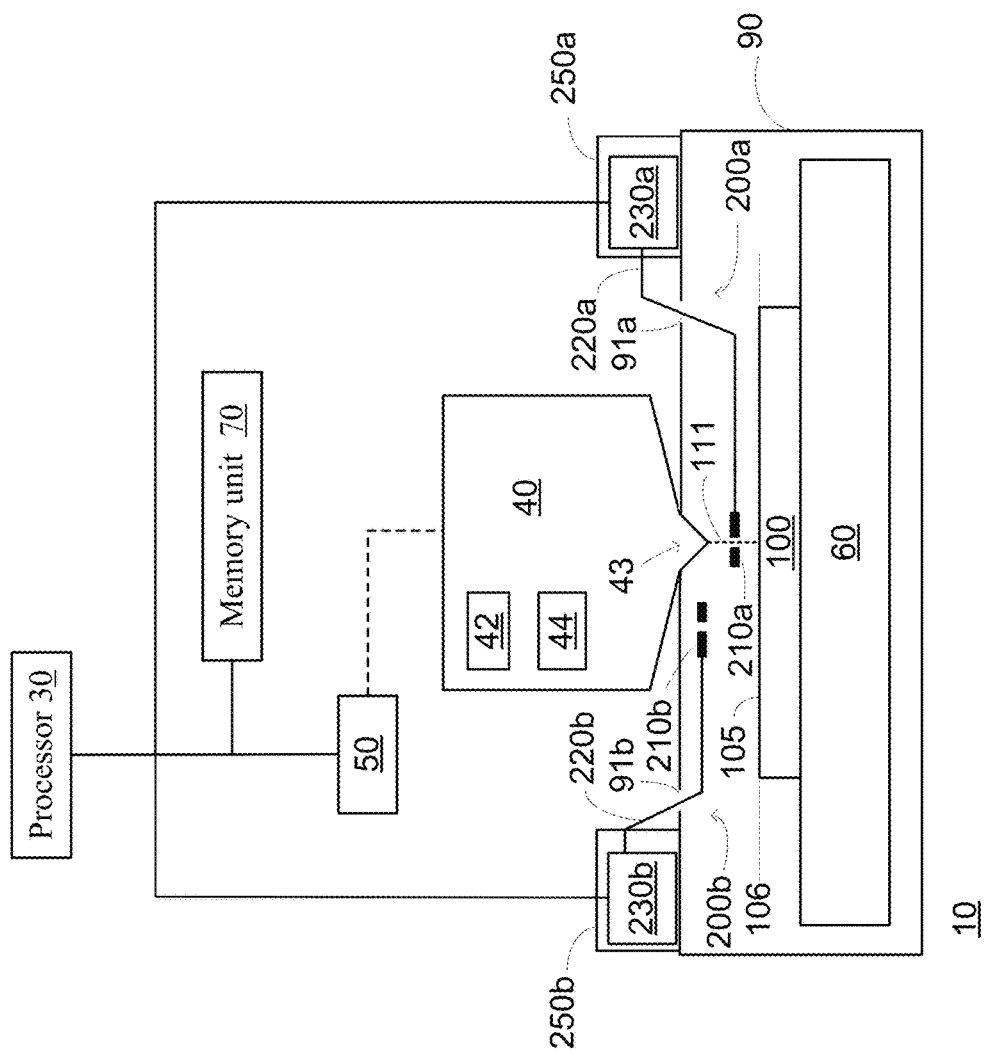
FIG. 1 illustrates a specimen and a charged particle beam system according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention can be practiced without these specific details. In other instances, well-known methods, procedures, and components have not been described in detail so as not to obscure the present invention.

Because the illustrated embodiments of the present invention can for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that can be executed by the system.

FIG. 1 illustrates charged particle beam system 10 and specimen 100 according to an embodiment of the invention.

The specimen 100 has a surface 105 that is scanned by the charged particle beam. Specimen surface 105 is located within a plane 106 that is referred to as the plane of the surface. The surface 105 is mostly flat in the sense that there up to nanometric scale height differences between different points of the flat surface.

Charged particle beam system 10 is illustrated as being a charged particle imager such as but not limited to a scanning electron microscope (SEM) or an electron beam inspection system.

Charged particle beam system 10 includes controller 50, movable stage 60, charged particle beam optics 40, detectors 200a and 200b, detector motion modules 250a and 250b, specimen chamber 90, memory unit 70, and processor 30.

Controller 50 is configured to control the operation of at least some of the various components of charged particle beam system 10.

Movable stage 60 is configured to support specimen 100 and move specimen according to a mechanical scan pattern.

Charged particle beam optics 40 is configured to (a) generate a primary charged particle beam 111, (b) deflect and otherwise direct the primary charged particle beam 111 to exit through a tip 43 of charged particle beam optics 40 to impinge on surface 105 of specimen 100, and (c) detect electrons that are emitted or reflected from surface 105.

In FIG. 1, the charged particle beam optics 40 is illustrated as including in-lens secondary electron detector 42 and in-lens backscattered electron detector 44. It is noted that charged particle beam optics 40 can include one or more out-lens electron detectors, can have one or more secondary electron detectors, can include one or more backscattered electron detectors, or can include any combination of electron detectors or other detectors.

The system also includes detectors 200a, 200b. While the example shown in FIG. 1 includes two out-lens detectors 200a and 200b, it should be appreciated that the features described herein can be implemented in systems with any number of detectors (including one). Additionally, while the example shown in FIG. 1 is described below as including an electron detector and an energy dispersive X-ray (EDX) detector, the embodiments described herein are not limited to any particular type of detector and may include any detector used in a charged particle beam system. Also, the detectors may be configured to receive any of a number of signals including x-ray photons, secondary electrons, backscattered electrons, Auger electrons, and the like.

Detector motion modules 250a and 250b are configured to move the detectors 200a and 200b between inserted and retracted positions. FIG. 1 illustrates detector 200a in the inserted position in which tip 210a is positioned between tip 43 of charged particle beam optics 40 and specimen 100. FIG. 1 illustrates detector 200b in the retracted position in which tip 210b is spaced apart from tip 43 of charged particle beam optics 40. In the retracted position, tip 210b does not interfere with any measurements performed by charged particle beam optics 40.

Specimen 100 can be a wafer, a micro-machined object, a solar panel and the like. Specimen 100 can be relatively large (for example—have a diameter of 300 millimeters) and detector, even when positioned at a retracted position, can be positioned directly above specimen 100.

Accordingly, the projection of the detectors 200a and 200b on plane 106 virtually falls on specimen 100 when the detectors 200a and 200b are positioned at either the inserted position or the retracted position.

Detector 200a includes tip 210a, detector conduit 220a, and detector amplifier 230a. FIG. 1 illustrates detector 200a as being positioned in the inserted position in which the tip 210a is positioned between tip 43 of charged particle beam optics 40 and specimen 100. Primary charged particle beam 111 passes through an aperture formed in the tip 210a. Detector conduit 220a passes through a specimen chamber opening 91a.

When detector 200a is positioned at the inserted position, the tip 210a is very close (for example—few tenths of nanometers) to surface 105 and thus detector 200a is able to detect x-ray photons and/or charged particles that propagate within a larger angular range than detectors that are more distant from surface 105.

Detector 200b includes tip 210b, detector conduit 220b, and detector amplifier 230b. FIG. 1 illustrates detector 200b as being positioned in the retracted position in which the tip 210b is spaced apart from tip 43 of charged particle beam optics 40.

Detector motion module 250a can move detector 200a between the inserted and retracted positions, and detector motion module 250b can move detector 200b between the inserted and retracted positions.

Movable stage 60 can follow a mechanical scan pattern and charged particle beam optics 40 can deflect primary charged particle beam 111 thereby scanning surface 105.

Depending on the type of detector, x-ray photons and/or charged particles (e.g., electrons) emitted as a result of scanning surface 105 are detected by the detector. As an example, detector 200a may be an EDX detector that includes an x-ray sensitive element such as a photodiode. The x-ray sensitive element generates detection signals indicative of the detected x-ray photons. The detection signals may be sent via detector conduit 220a to detector amplifier 230a and can then be stored in memory unit 70 or processed by processor 30. It is noted that the detection signals may be converted to digital detection signals by detector amplifier 230a or by an analog to digital converter that does not belong to detector amplifier 230a.

Processor 30 can correlate or otherwise associate between points of the specimen that were illuminated (by primary charged particle beam 111) during the scanning of surface 105 and detection signals generated by the detector.

In some embodiments, processor 30 can be configured to evaluate compositions of the points of the specimen that were illuminated during the scanning of the surface 105.

As another example, detector 200b may be an electron detector that includes an electron sensitive element such as a photodiode. The electron sensitive element generates detection signals indicative of the detected electrons. The detection signals may be sent via detector conduit 220b to detector amplifier 230b and can then be stored in memory unit 70 or processed by processor 30. It is noted that the detection signals may be converted to digital detection signals by detector amplifier 230b or by an analog to digital converter that does not belong to detector amplifier 230b.

Processor 30 can correlate or otherwise associate between points of the specimen that were illuminated (by primary charged particle beam 111) during the scanning of surface 105 and detection signals generated by the detector.

Figure 2:
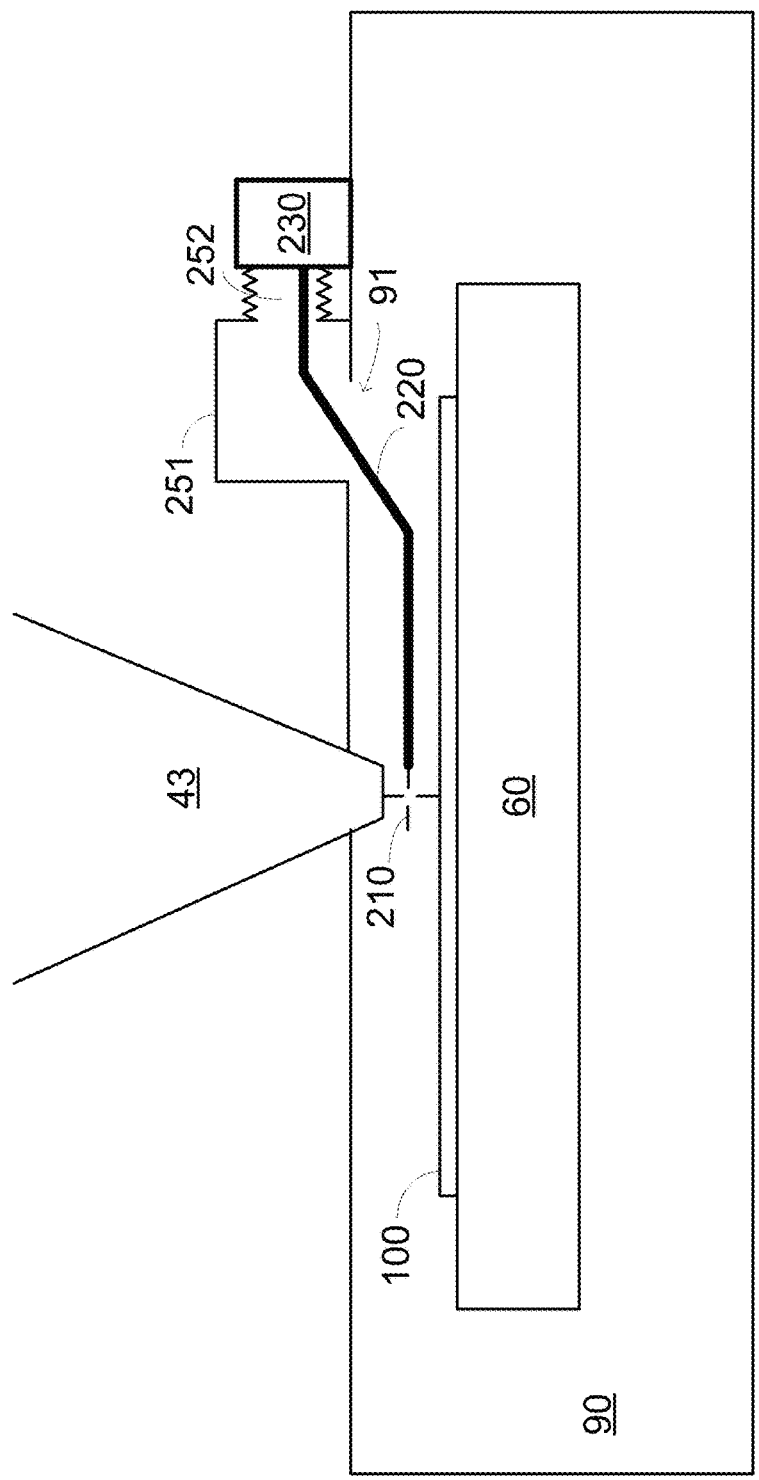
FIG. 2 is a cross sectional view of a charged particle beam system and a specimen according to an embodiment of the invention.

FIG. 2 is a cross sectional view of charged particle beam system 10 and specimen 100 according to an embodiment of the invention. This example only shows one detector but may include more than one detector in some embodiments.

Detector amplifier 230 is positioned outside specimen chamber 90 and tip 210 is positioned within specimen chamber 90—at least when detector 200 is positioned at the inserted position.

Tip 210 is coupled to detector amplifier 230 via detector conduit 220. In FIG. 2, the detector 200 is positioned in an inserted position and the primary charged particle beam passes through an aperture formed in tip 210.

Detector conduit 220 passes through specimen chamber opening 91.

Specimen 100 is supported by movable stage 60.

In order to maintain very low specimen chamber pressure, the specimen chamber 90 should be sealed regardless of the position of the detector 200.

The sealing is obtained by including a cover 251 and bellows 252 that surround detector conduit 220 and seal the detector conduit 220 and the specimen chamber 90 from the environment.

Bellows 252 is flexible and is connected between detector amplifier 230 and cover 251.

Figure 3:
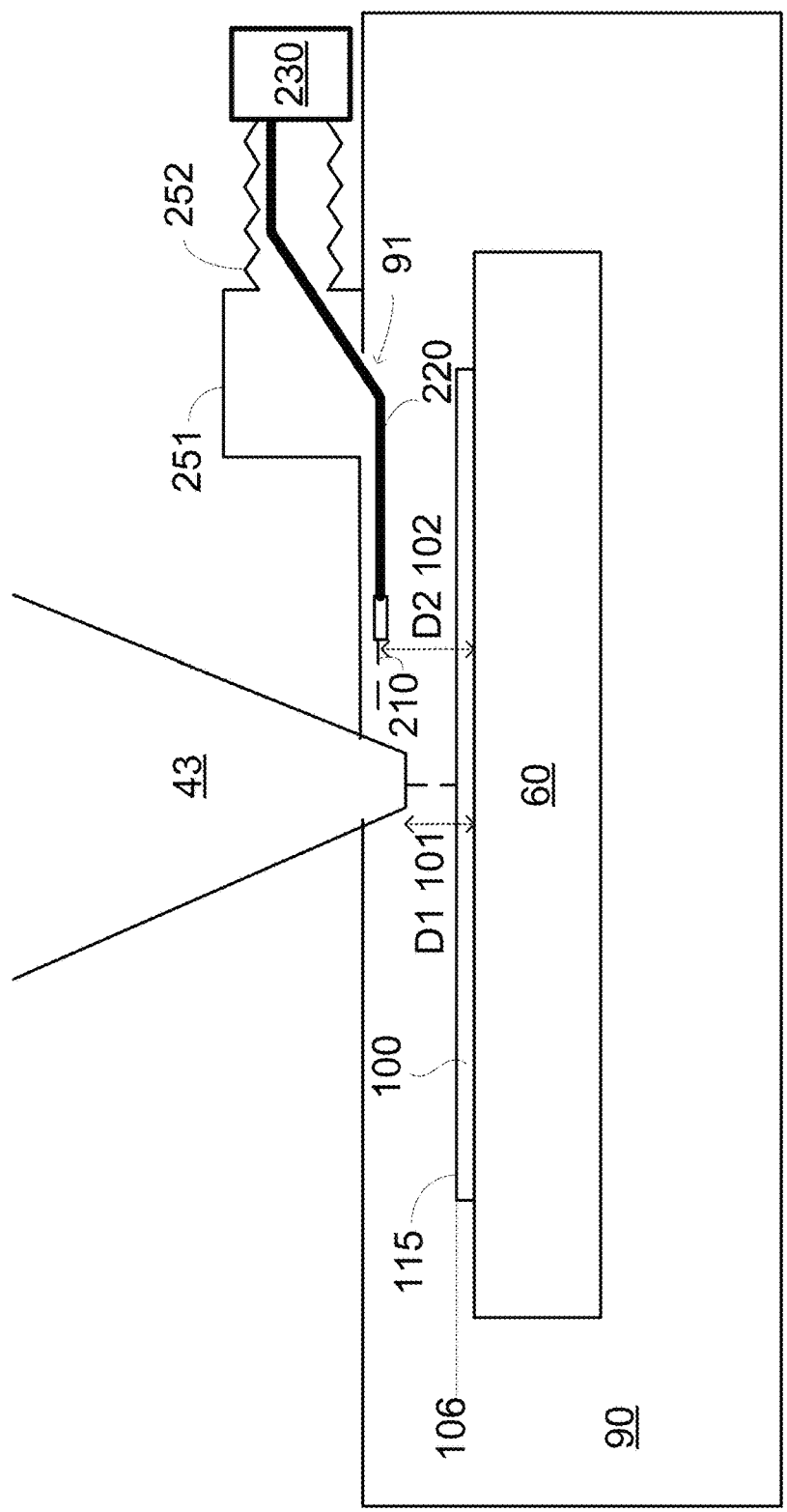
FIG. 3 is a cross sectional view of a charged particle beam system and a specimen according to an embodiment of the invention.

FIG. 3 is a cross sectional view of charged particle beam system 10 and specimen 100 according to an embodiment of the invention.

FIG. 3 illustrates detector 200 as being positioned in a retracted position in which tip 210 is spaced apart from the charged particle beam optics tip 43 and the specimen 100. Tip 210 does not interfere with any measurements performed by charged particle beam optics 40.

When in the retracted position, the distance (D1 101) between tip 210 and the movable stage 60 exceeds the distance (D2 102) between the movable stage and the tip 43 of charged particle beam optics 40.

The detector 200 can be moved in various manners between the inserted and retracted positions. For example, detector 200 can be moved from the retracted position to the inserted position by downward and outward movements.

Figure 4:
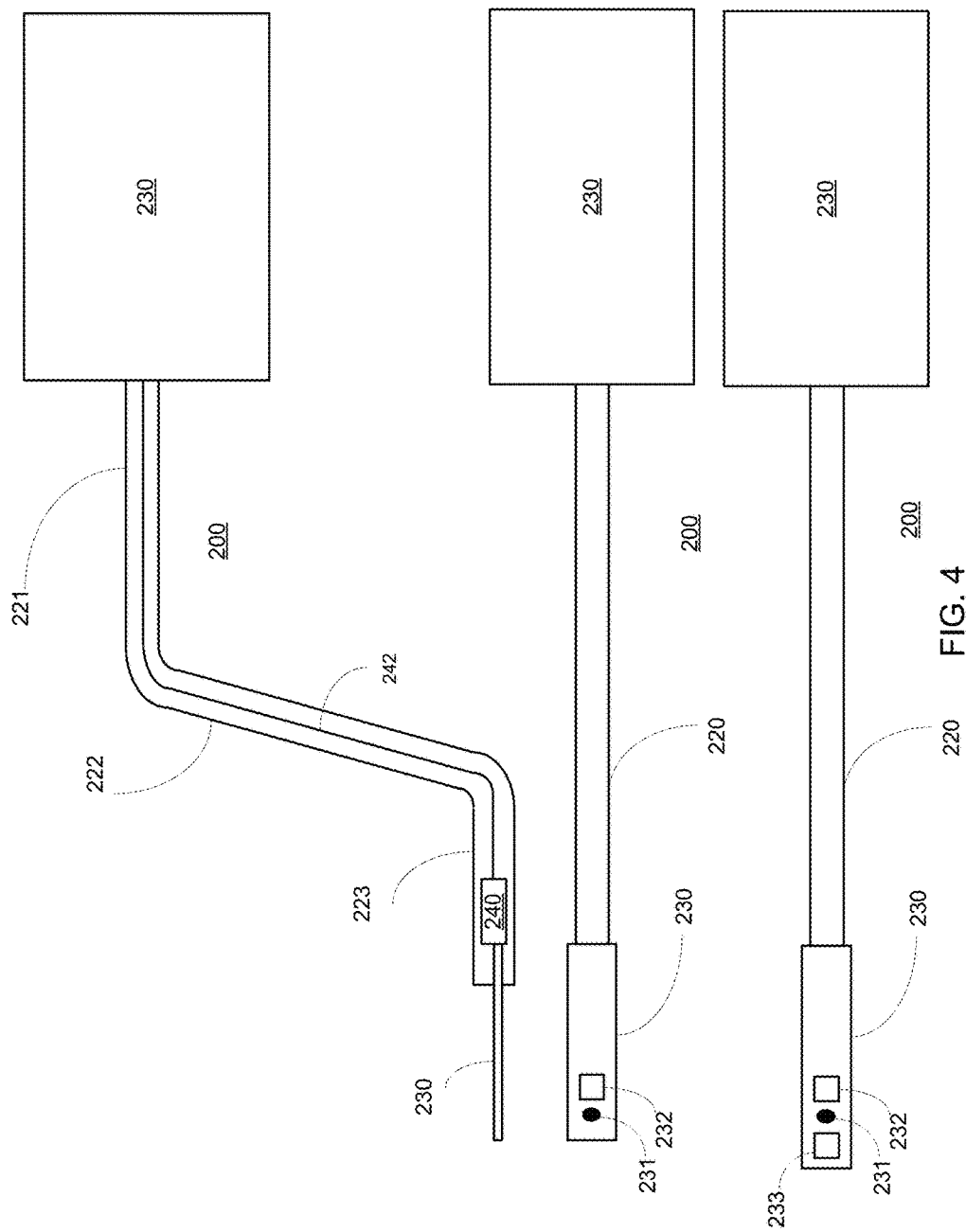
FIG. 4 includes a top view and a side view of an EDX detector according to an embodiment of the invention.

FIG. 4 includes a top view and a side view of detector 200 according to an embodiment of the invention. The detector illustrated is an EDX detector.

Tip 210 is coupled to detector amplifier 230 via detector conduit 220.

For EDX detectors, tip 210 is may include aperture 231 and window 232. A primary charged particle beam can pass through aperture 231 when detector 200 is at the inserted position. X-ray photons emitted from the specimen pass through window 232 and are detected by x-ray sensitive element 240 of detector 200. The x-ray sensitive element 240 can be positioned within detector tip 210 but this is not necessarily so.

X-ray sensitive element 240 generates detection signals that are sent, via conductor 242, to detector amplifier 230.

Detector conduit 220 is illustrated as including upper horizontal portion 221, lower horizontal portion 223, and sloped intermediate portion 222 that is connected between the upper horizontal portion 221 and the lower horizontal portion 223.

Detector conduit 220 can be rigid or elastic. Detector conduit 220 may have any shape or size.

FIG. 4 also illustrates an alternative configuration of detector tip 210—that includes multiple windows 232 and 233 that are arranged in a symmetrical manner on both sides of aperture 231.

Figure 5:
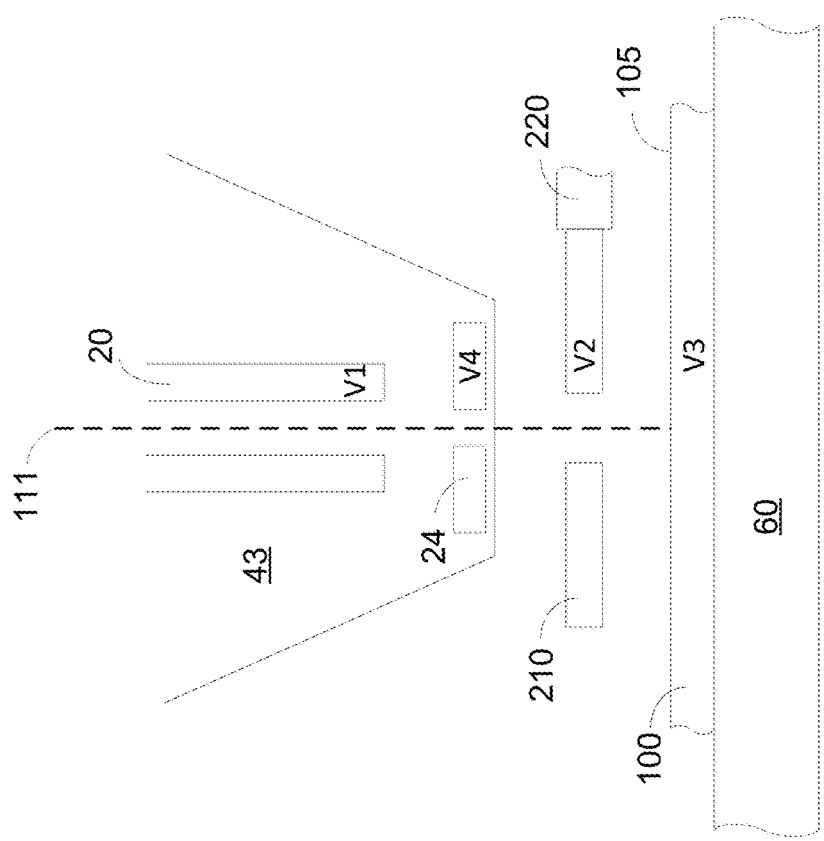
FIG. 5 illustrates some of the electrodes in a charged particle beam system according to an embodiment of the invention.

FIG. 5 illustrates some of the electrodes in a charged particle beam system according to an embodiment of the invention. The charged particle beam optics typically includes a magnetic lens and an electrostatic lens. In this example, an anode tube 20 serves as a first electrode, the tip 210 of the detector serves as a second electrode, a surface 105 of the specimen 100 serves as a third electrode, and electrode 24 serves as a fourth electrode. In some embodiments, the anode tube 20 may be replaced by a conductive cap, or alternatively a conductive cap may serve as another electrode. At least some of these electrodes form the electrostatic lens. Other electrodes may be included in other embodiments. The electrostatic lens may be biased to alter the landing energy, resolution, and efficiency of a primary charged particle beam.

Figure 6:
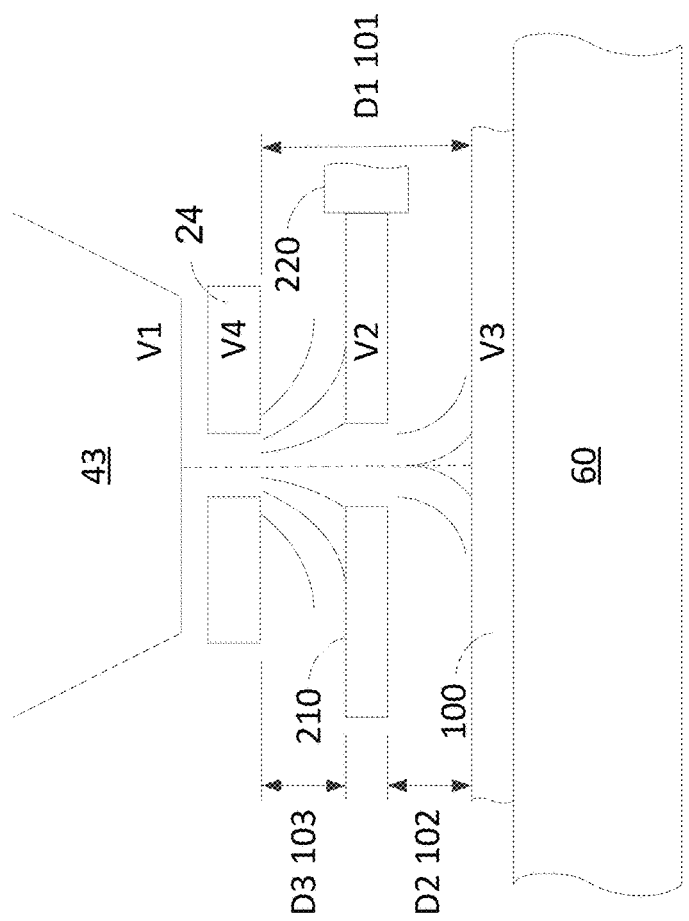
FIG. 6 illustrates a tip of a charged particle beam optics, an axis of a charged particle beam, an electrode, an aperture disposed at a tip of a detector, and a specimen according to an embodiment of the invention.

In some embodiments, electrode 24 may be disposed between tip 43 of the charged particle beam optics and tip 210 when the detector 220 is in the inserted position (see FIG. 6). In this position the electrode 24 may have minimal impact on the landing energy, resolution, and efficiency of the primary charged particle beam, but may be used to minimize deflection of the primary charged particle beam.

The anode tube 20 and electrode 24 may be coupled in some embodiments with an isolator disposed therebetween. In other embodiments, the anode tube 20 and the electrode 24 may be non-coupled but placed so that both are above the tip 210 when the detector is in the inserted position. It should be appreciated that the various electrodes and components shown in these figures are provided merely as examples and are not necessarily intended to represent relative sizes or particular geometries.

FIG. 6 illustrates a tip 43 of a charged particle beam optics, a charged particle beam (or an axis of a charged particle beam) 111, an electrode 24, an aperture disposed at a tip 210 of a detector, and a specimen 100 according to an embodiment of the invention. This figure shows a first electric field created by a potential difference between tip 43 of the charged particle beam optics and tip 210 of the detector (or between anode tube 20 (not shown) and tip 210), and a second electric field created by a potential difference between tip 210 and surface 105 of the specimen 100 (or the movable stage 60).

Slight movements of the detector can cause perturbations in the electric fields due to misalignment between the charged particle beam 111 and the aperture of tip 210. The movements can be caused by vibrations of the detector and differences in position of the detector as it is moved from the retracted position to the inserted position. Voltages of the tip 43 of the charged particle beam optics (V1), the tip 210 of the detector 220 (V2), the specimen 100 or movable stage 60 (V3), and electrode 24 (V4) can be determined to minimize deflection of the charged particle beam 111 as it propagates from the tip 43 to the specimen 100. In some embodiments, the voltage (V4) of electrode 24 can be used to minimize deflection based on voltage settings of the other electrodes. The voltages can be determined based in part on a position of the axis of the charged particle beam 111 relative to a position of the aperture.

Following is an example of how the voltages can be determined to minimize deflection. For a particular charged particle beam system, the potential distribution is in an axial symmetry electrostatic lens represented by:

$$\Phi_{lens}(r, z) = \varphi(z) - \frac{1}{4}\varphi''(z)r^2 + \frac{1}{64}\varphi''''(z)r^4 - \ldots \quad \text{Equation (1)}$$

where $\varphi(z)$ is the axial potential distribution, and r, z, and θ are cylindrical coordinates of a point.

In this example, the potential of the electrostatic deflector is given by:

$$\Phi_{def}(r, \theta, z) = \quad \text{Equation (2)}$$
$$\left[ f_1(z)r - \frac{1}{8}f_1''(z)r^3 + \ldots \right]\cos\theta + f_3(z)r^3\cos 3\theta + \ldots$$

where $f_i$ is the $2^i$-pole field.

The perturbed potential distribution of the electrostatic lens with a misaligned detector may be represented by:

$$\Phi_{per} = \Phi_{lens} + \Phi_{def} \quad \text{Equation (3)}$$

Since $f_i$ depend on lens geometry ($D_j$) and electrostatic potentials ($V_j$), conditions for a given geometry that meet the condition for $r < R_0$ may be determined by:

$$\lim_{V_j \to V_0} \Phi_{def} \to 0 \quad \text{Equation (4)}$$

where $R_0$ >> detector misalignment.

Figure 7:
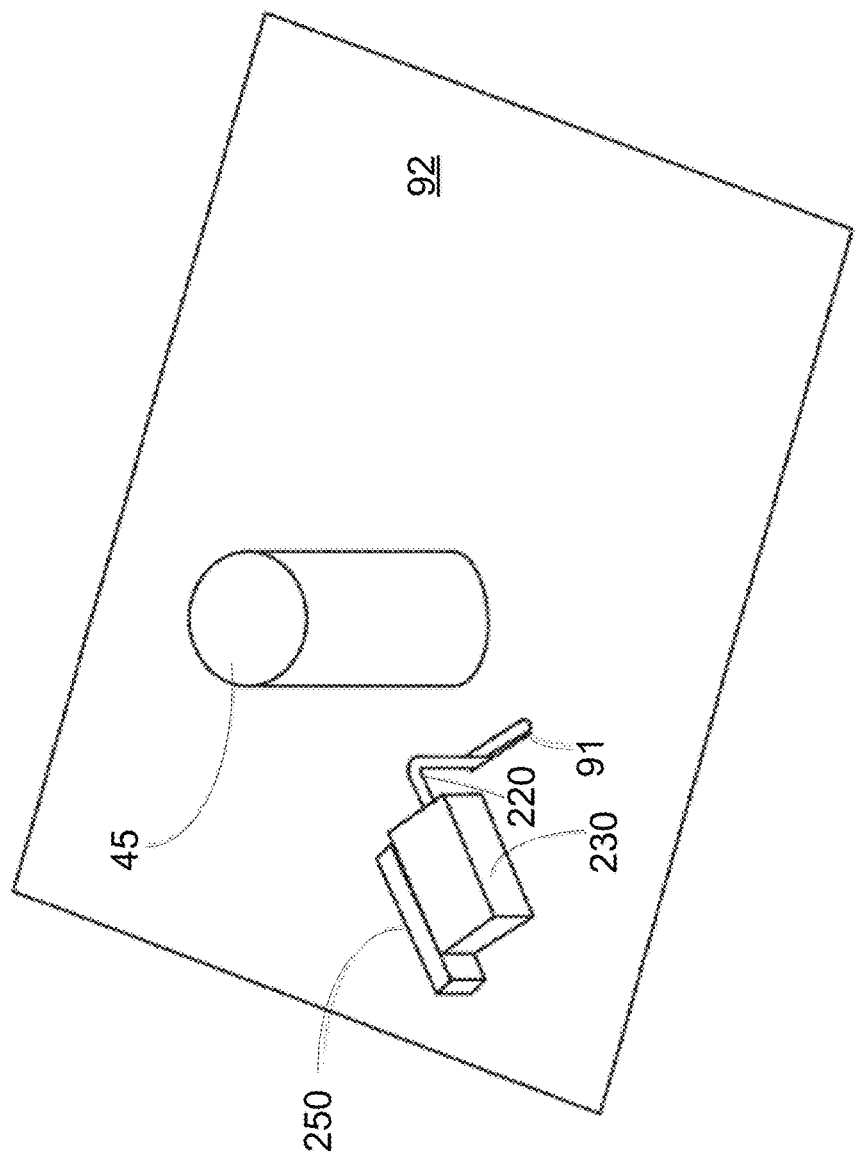
FIGS. 7-8 illustrate an upper facet of a specimen chamber, a detector motion module, a detector amplifier, a detector conduit, a specimen chamber opening, and a column of charged particle beam optics according to some embodiments of the invention.

FIG. 7 illustrates an upper facet 92 (or upper cover) of specimen chamber, detector motion module 250, detector amplifier 230, detector conduit 220, specimen chamber opening 91, and a column 45 of charged particle beam optics according to an embodiment of the invention.

In FIG. 7, the detector 200 is in the inserted position. Cover 251 and bellows 252 are not shown for simplicity of explanation.

Detector motion module 250 contacts the detector amplifier 230 and moves detector amplifier 230 in order to change the position of detector 200. Alternatively, the detector motion module 250 may move only detector 200.

Figure 8:
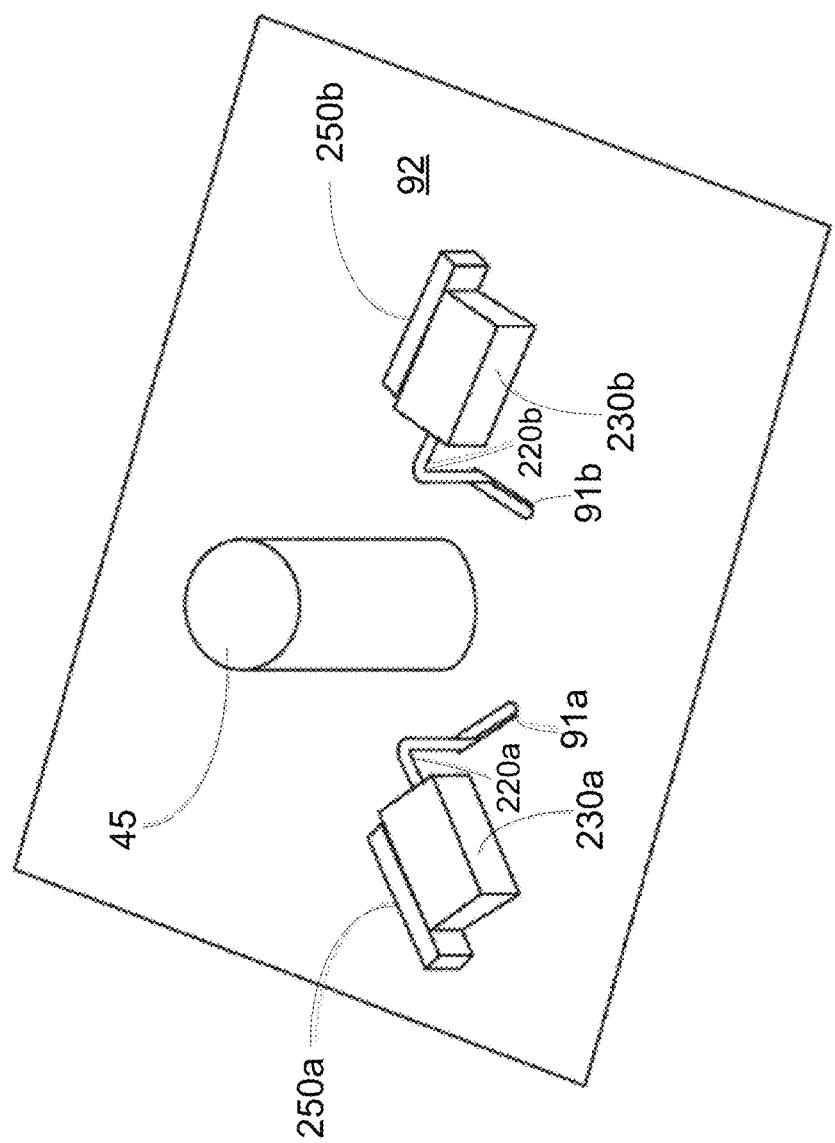

FIG. 8 illustrates an embodiment that includes two detectors mounted on an upper facet 92 (or upper cover) of specimen chamber. FIG. 8 shows detector motion modules 250a and 250b, detector amplifiers 230a and 230b, detector conduits 220a and 220b, specimen chamber openings 91a and 91b, and a column 45 of charged particle beam optics. Covers and bellows are not shown for simplicity of explanation.

Detector motion modules 250a and 250b move the detectors between inserted and retracted positions.

Figure 9:
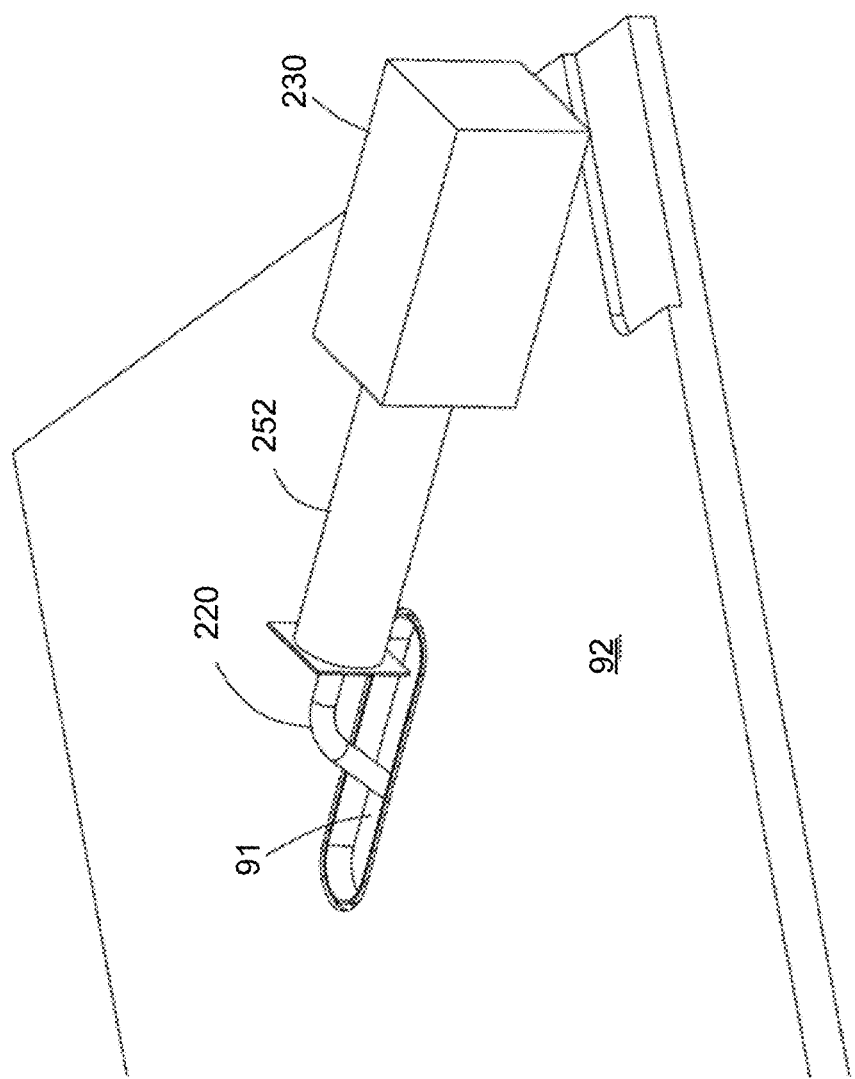
FIG. 9 illustrates a portion of an upper facet of a specimen chamber, a detector amplifier, a detector conduit, bellows, and a specimen chamber opening according to an embodiment of the invention.

FIG. 9 illustrates a portion of the upper facet 92 of specimen chamber, detector amplifier 230, detector conduit 220, bellows 252 and specimen chamber opening 91 according to an embodiment of the invention.

In FIG. 9, the detector 200 is in the inserted position. Cover 251 is not shown for simplicity of explanation.

Figure 10:
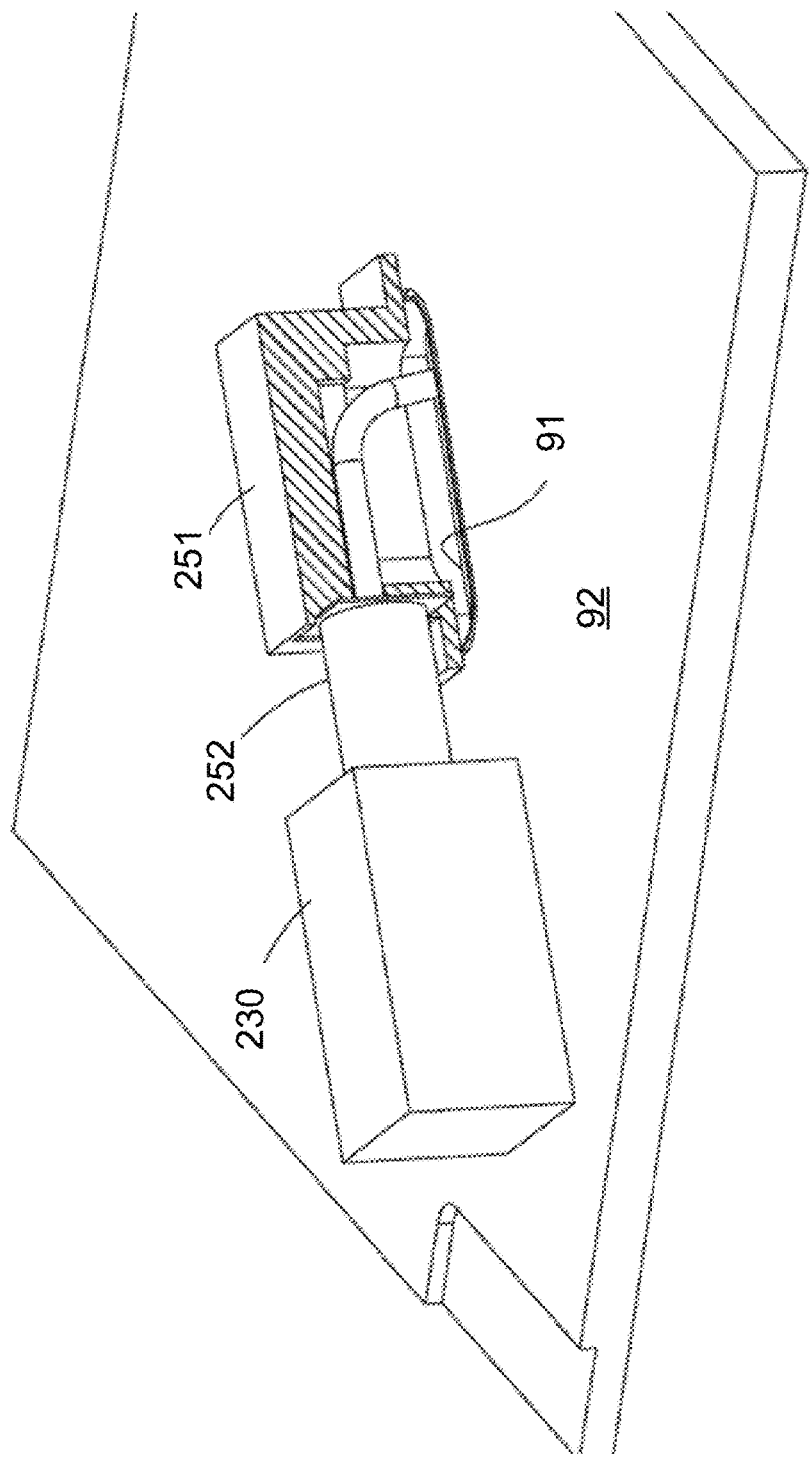
FIG. 10 illustrates a portion of an upper facet of a specimen chamber, a detector amplifier, a detector conduit, a cover, bellows, and a specimen chamber opening according to an embodiment of the invention.

FIG. 10 illustrates a portion of the upper facet 92 of specimen chamber, detector amplifier 230, detector conduit 220, bellows 252, cover 251, and specimen chamber opening 91 according to an embodiment of the invention.

In FIG. 10, the detector 200 is in the inserted position.

Figure 11:
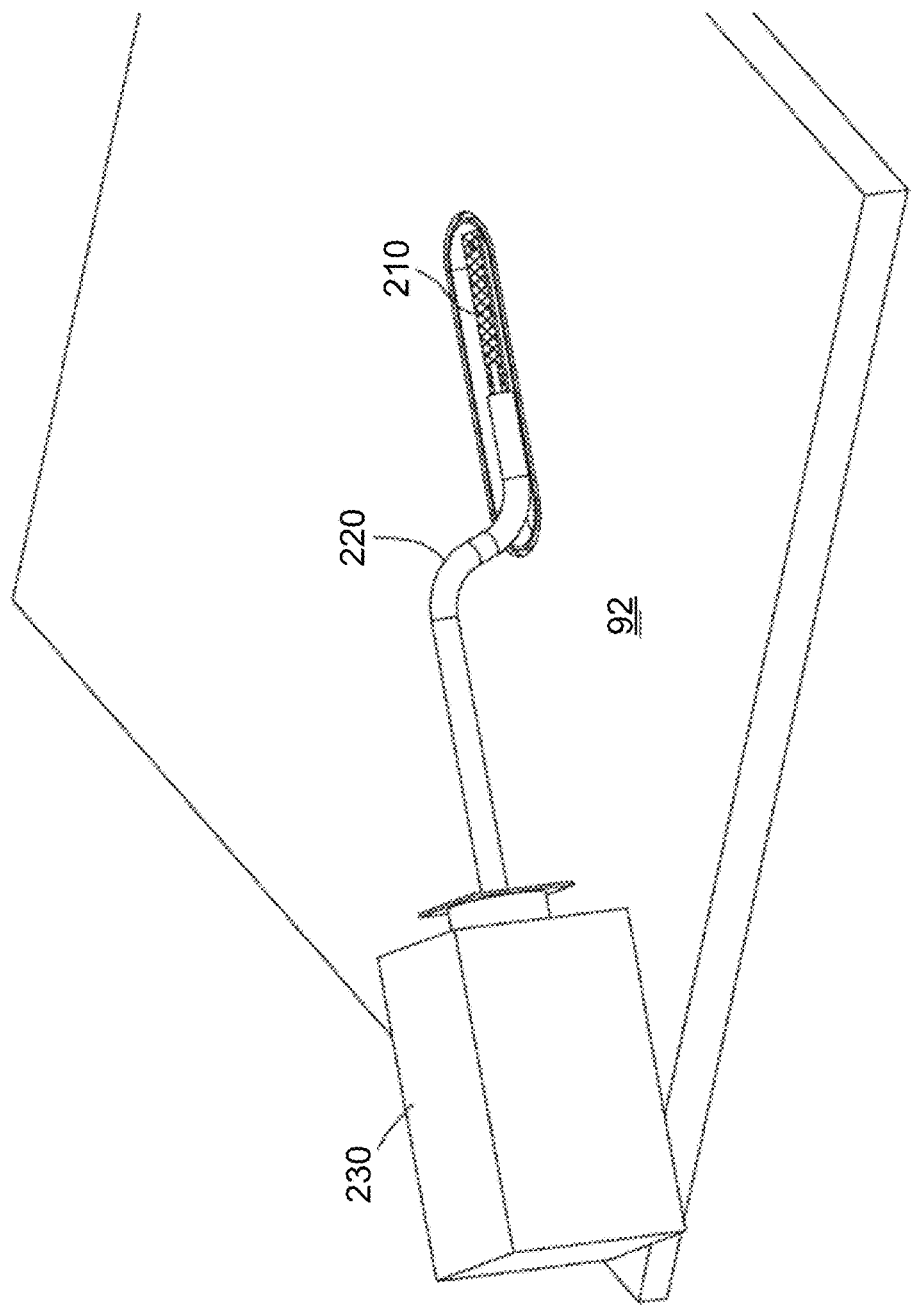
FIG. 11 illustrates a portion of an upper facet of a specimen chamber, a detector amplifier, a detector conduit, and a detector tip according to an embodiment of the invention.

FIG. 11 illustrates a portion of an upper facet 92 of specimen chamber, detector amplifier 230, detector conduit 220, and detector tip 210 according to an embodiment of the invention.

In FIG. 11, the detector 200 is in the retracted position. Cover 251 and bellows 252 are not shown for simplicity of explanation.

Figure 12:
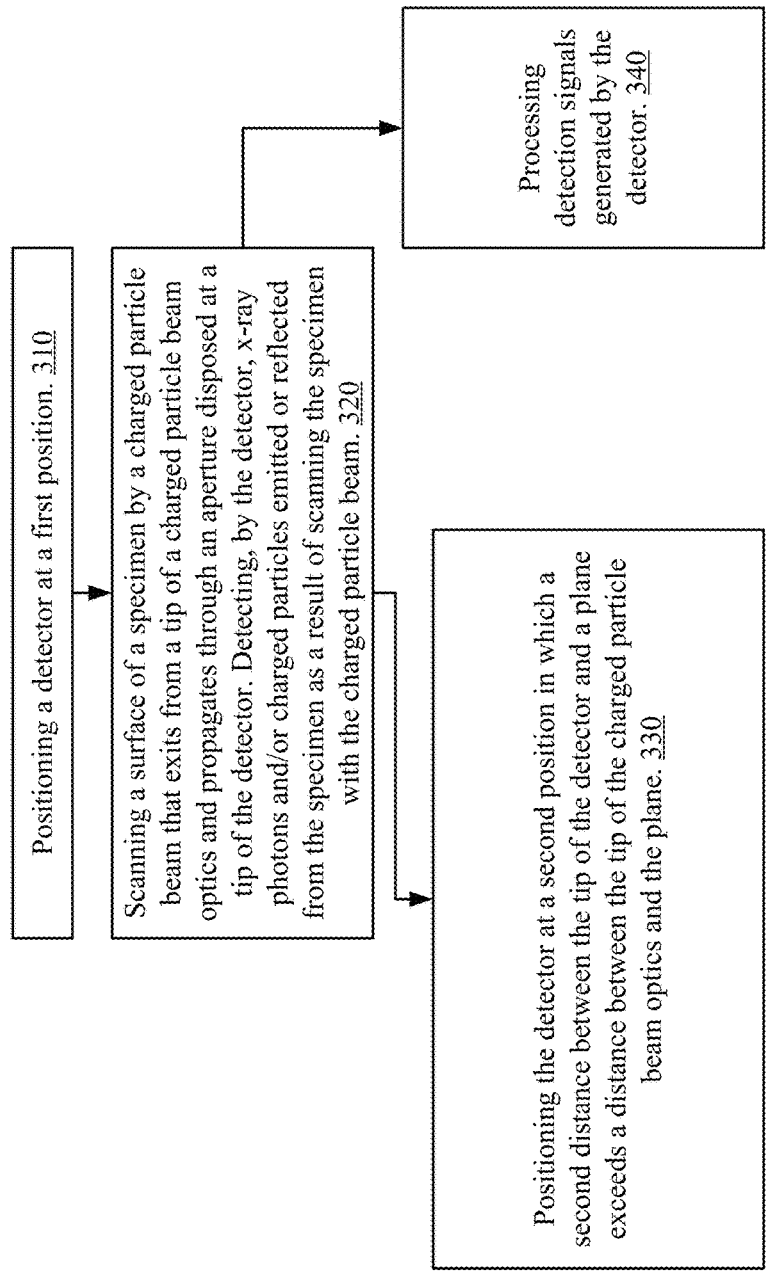
FIG. 12 illustrates a method according to an embodiment of the invention.

FIG. 12 illustrates method 300 according to an embodiment of the invention.

Method 300 can start by step 311 of positioning a detector in an inserted position. The detector may be an EDX detector or an electron detector.

Step 311 can be followed by step 320 of (i) scanning a surface of a specimen by a charged particle beam that exits from a tip of a charged particle beam optics and propagates through an aperture disposed at a tip of the detector, and (ii) detecting, by the detector, x-ray photons and/or charged particles emitted or reflected from the specimen as a result of scanning the specimen with the charged particle beam. The charged particles may be secondary or backscattered electrons.

Step 320 can be followed by steps 330 and 340.

Step 330 can include positioning the detector at a retracted position in which a second distance between the tip of the detector and a plane exceeds a distance between and the tip of the charged particle beam optics and the plane.

Moving the detector between the inserted and retracted positions may include moving the detector along a first direction that is parallel to the plane and moving the detector along a second direction that is perpendicular to the plane.

A projection of the detector on the plane virtually falls on the surface when the detector is positioned at the inserted position and when the detector is positioned at the retracted position.

Step 340 can include processing detection signals generated by the detector. The signals may provide images of the specimen or estimated compositions of the specimen.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may, for example, be direct connections or indirect connections. The connections may be illustrated or described in reference to being a single connection, a plurality of connections, unidirectional connections, or bidirectional connections. However, different embodiments can vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals can be implemented as negative logic signals, and those signals described as negative logic signals can be implemented as positive logic signals.

Those skilled in the art will recognize that the boundaries between logic blocks are merely illustrative and that alternative embodiments can merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations can be combined into a single operation, a single operation can be distributed in additional operations and operations can be executed at least partially overlapping in time. Moreover, alternative embodiments can include multiple instances of a particular operation, and the order of operations can be altered in various other embodiments.

Also for example, in one embodiment, the illustrated examples can be implemented as circuitry located on a single integrated circuit or within a same device. Alternatively, the examples can be implemented as any number of separate integrated circuits or separate devices interconnected with each other in a suitable manner.

Also for example, the examples, or portions thereof, can implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for evaluating a specimen using a charged particle beam system having charged particle beam optics, the method comprising:
    positioning a detector in an inserted position in which a first distance between a tip of the detector and a plane extending along a surface of the specimen is less than a distance between a tip of the charged particle beam optics and the plane, and while maintaining the detector at the inserted position:
        scanning the surface of the specimen by a primary beam that exits from the tip of the charged particle beam optics and propagates through an aperture disposed near the tip of the detector;
        detecting, by the detector, x-ray photons and/or charged particles emitted or reflected from the specimen as a result of scanning the specimen with the primary beam;
    after completion of the scanning, positioning the detector at a retracted position in which a second distance between the tip of the detector and the plane exceeds a distance between the tip of the charged particle beam optics and the plane;
    wherein the detector includes a conduit having an upper horizontal portion, a lower horizontal portion, and a sloped intermediate portion coupled between the upper horizontal portion and the lower horizontal portion.

2. The method according to claim 1 wherein the detector is an energy dispersive X-ray (EDX) detector, and the EDX detector detects the x-ray photons emitted from the specimen.

3. The method according to claim 1 wherein the detector is an electron detector, and the electron detector detects secondary electrons emitted from the specimen and/or backscattered electrons reflected from the specimen.

4. The method according to claim 1 wherein positioning of the detector at the retracted position comprises moving the detector along a first direction that is parallel to the plane and along a second direction that is perpendicular to the plane.

5. A charged particle beam system, comprising:
    a controller;
    a movable stage configured to support a specimen;
    charged particle beam optics having a tip configured to output a primary charged particle beam, the charged particle beam optics comprising a magnetic lens and an electrostatic lens;
    a retractable detector configured to detect x-ray photons and/or charged particles emitted or reflected from the specimen, the retractable detector including an amplifier and a conduit, the conduit surrounding a conductor that is coupled between a sensor of the retractable detector and the amplifier, wherein the conduit comprises an upper horizontal portion, a lower horizontal portion, and a sloped intermediate portion coupled between the upper horizontal portion and the lower horizontal portion; and
    a detector motion module configured to move the retractable detector between an inserted position and a retracted position;
    wherein, when the retractable detector is positioned at the inserted position, a tip of the retractable detector is positioned between the tip of the charged particle beam optics and the movable stage;
    wherein, when the retractable detector is positioned at the retracted position, a distance between the tip of the retractable detector and the movable stage exceeds a distance between the tip of the charged particle beam optics and the movable stage.

6. The system according to claim 5 wherein the retractable detector is an energy dispersive X-ray (EDX) detector, and the tip of the EDX detector is configured for detecting the x-ray photons emitted from the specimen.

7. The system according to claim 5 wherein the retractable detector is an electron detector, and the tip of the electron detector is configured for detecting secondary electrons emitted from the specimen and/or backscattered electrons reflected from the specimen.

8. The system according to claim 5 further comprising:
an energy dispersive X-ray (EDX) detector having a sensor for detecting the x-ray photons emitted from the specimen; and
an EDX detector motion module configured to move the EDX detector between an inserted position and a retracted position;
wherein, when the EDX detector is positioned at the inserted position, a tip of the EDX detector is positioned between the tip of the charged particle beam optics and the movable stage;
wherein, when the EDX detector is positioned at the retracted position, a distance between the tip of the EDX detector and the movable stage exceeds a distance between the tip of the charged particle beam optics and the movable stage.

9. The system according to claim 5 further comprising:
an electron detector having a sensor for detecting secondary electrons emitted from the specimen and/or backscattered electrons reflected from the specimen; and
an electron detector motion module configured to move the electron detector between an inserted position and a retracted position;
wherein, when the electron detector is positioned at the inserted position, a tip of the electron detector is positioned between the tip of the charged particle beam optics and the movable stage;
wherein, when the electron detector is positioned at the retracted position, a distance between the tip of the electron detector and the movable stage exceeds a distance between the tip of the charged particle beam optics and the movable stage.

10. The system according to claim 5 wherein the detector motion module is configured to move the retractable detector from the retracted position to the inserted position by moving a portion of the retractable detector downwards and moving the portion of the retractable detector inward towards the tip of the charged particle beam optics.

11. The system according to claim 5 further comprising a specimen chamber with one or more chamber openings through which the conduit passes, wherein the one or more chamber openings are sealed by bellows.

12. The system according to claim 5 wherein the lower horizontal portion comprises the tip of the retractable detector.

13. A method of scanning a specimen using a charged particle beam system having a charged particle beam optics, a detector, and a movable stage configured to support the specimen, the method comprising:
positioning the detector in an inserted position between the charged particle beam optics and the specimen so that an axis of a primary beam emitted from a tip of the charged particle beam optics passes through an aperture disposed near a tip of the detector;
setting the charged particle beam optics to a first voltage;
setting the detector to a second voltage;
setting the specimen to a third voltage;
determining a fourth voltage of an electrode disposed between the tip of the charged particle beam optics and the detector, the fourth voltage determined based in part on a position of the axis of the charged particle beam relative to a position of the aperture, and wherein the fourth voltage is determined to minimize deflection of the primary beam as the primary beam propagates from the tip of the charged particle beam optics, through the aperture, and to the specimen;
scanning the specimen using the primary beam, the primary beam emitted from the charged particle beam optics and propagating through the aperture, the scanning performed while the charged particle beam optics is maintained at the first voltage, the detector is maintained at the second voltage, the specimen is maintained at the third voltage, and the electrode is maintained at the fourth voltage;
detecting, by the detector, x-ray photons and/or charged particles emitted from the specimen as a result of scanning the specimen with the primary beam.

14. The method of claim 13 further comprising moving the detector from the inserted position to a retracted position in which a distance between the tip of the detector and a plane extending along a surface of the specimen exceeds a distance between the tip of the charged particle optics and the plane.

15. The method of claim 13 wherein the detector is an energy dispersive X-ray (EDX) detector, and the EDX detector detects the x-ray photons emitted from the specimen.

16. The method of claim 13 wherein the detector is an electron detector, and the electron detector detects secondary electrons emitted from the specimen and/or backscattered electrons reflected from the specimen.

* * * * *